(12) United States Patent
Duan et al.

(10) Patent No.: US 11,144,578 B2
(45) Date of Patent: Oct. 12, 2021

(54) HIGH PERFORMANCE AND EFFICIENT MULTI-SCALE TRAJECTORY RETRIEVAL

(71) Applicant: International Business Machines Corporation, Armonk, NY (US)

(72) Inventors: Ning Duan, Shanghai (CN); Guo Qiang Hu, Shanghai (CN); Peng Ji, Nanjing (CN); Xiao Bo Li, Zhejiang (CN); Zhi Hu Wang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 841 days.

(21) Appl. No.: 14/925,491

(22) Filed: Oct. 28, 2015

(65) Prior Publication Data

US 2017/0124115 A1 May 4, 2017

(51) Int. Cl.
*G06F 16/29* (2019.01)
*H03M 7/30* (2006.01)

(52) U.S. Cl.
CPC .............. *G06F 16/29* (2019.01); *H03M 7/60* (2013.01)

(58) Field of Classification Search
CPC ........................... G06F 17/30241; G06F 16/29
USPC ........................................................ 707/693
See application file for complete search history.

(56) References Cited

U.S. PATENT DOCUMENTS

| 2006/0129691 | A1* | 6/2006 | Coffee | .................... H04L 67/04 |
| | | | | 709/230 |
| 2013/0328937 | A1* | 12/2013 | Pirwani | .................. G09G 5/373 |
| | | | | 345/660 |
| 2014/0108361 | A1* | 4/2014 | Debmalya Biswas | .. G06F 17/30 |
| | | | | 707/693 |
| 2015/0026142 | A1 | 1/2015 | Wang | |

(Continued)

FOREIGN PATENT DOCUMENTS

| CN | 103795417 A | 5/2014 |
| EP | 2 685 440 A1 | 1/2014 |

OTHER PUBLICATIONS

Renchu Song, Weiwei Sun, Baihua Zheng, Yu Zheng, Press: A Novel Framework of Trajectory Compression in Road Networks, 2014, pp. 661-672.*

(Continued)

*Primary Examiner* — Allen S Lin
(74) *Attorney, Agent, or Firm* — Scully, Scott, Murphy & Presser, P.C.; Joseph Petrokaitis

(57) ABSTRACT

A system, method and computer program product for retrieving trajectory data from huge datasets. In the method, there is received, at a processor device, a user query including a request for displaying trajectory data at a user device. From the user query, a query type and a current map visualization scale setting (mapscale) for visualizing the trajectory data on the user device display is determined. Then, responsive to a user query type and the determined mapscale setting, a corresponding reference level is selected. Based on the selected reference level, there is accessed from (Continued)

a memory storage device a data set of compressed trajectory data. This compressed trajectory data set is communicated to the user device, for presentation on the user device display. In one aspect, the system and method is adaptive, enabling storage and retrieval of trajectory data according to various degrees of visualization or granularity.

19 Claims, 9 Drawing Sheets

(56) References Cited

U.S. PATENT DOCUMENTS

2017/0090853 A1* 3/2017 Khalatian ............... G06F 3/147

OTHER PUBLICATIONS

Gabriel Svennersberg, Simple maps with the Google Static Maps API, Dec. 8, 2008, In Usability We Trust, http://www.svennerberg.com/2008/12/simple-maps-with-the-google-static-maps-api/.*

Jordan Novet, Hands on with Google Maps' Your Timeline: Fascinating, but Freaky, VentureBeat, Jul. 27, 2015 https://venturebeat.com/2015/07/27/hands-on-with-google-maps-your-timeline-fascinating-but-freaky/(Year: 2015).*

Google Developers, The Google Directions API, captured Aug. 16, 2015, pp. 1-23, https://web.archive.org/web/20150816071927/https://developers.google.com/maps/documentation/directions/intro (Year: 2015).*

Song et al., "Press: A Novel Framework of Trajectory Compression in Road Networks", 40th International Conference on Very Large Data Bases, Sep. 1-5, 2014, Hangzhou, China, Proceedings of the VLDB Endowment, vol. 7, No. 9, pp. 661-672.

Schmid et al., "Semantic Trajectory Compression", Chapter, Advances in Spatial and Temporal Databases, vol. 5644 of the series Lecture Notes in Computer Science, pp. 411-416, Jul. 8-10, 2009 Proceedings.

Chen et al., "Compression of GTS Trajectories using Optimized Approximation", 21st International Conference on Pattern Recognition (ICPR 2012) Nov. 1-15, 2012, Tsukuba, Japan, pp. 3180-3183.

Muckell, et al., "A Framework for Efficient and Convenient Evaluation of Trajectory Compression Algorithms", published in Computing for Geospatial Research and Application (COM Geo) 2013 Fourth International Conference on, Jul. 22-24, 2013, pp. 24-31; Abstract Only: downloaded from Internet: http://ieeexplore.ieee.org/xpl/articleDetails.jsp?tp=&arnumber=6602036&ranges%3D2002_2015_p_Publication_Year%26queryText%3DTrajectory+Compression.

* cited by examiner

|  | MANJING SMART CITY CASE: TAXI | | HSAE CASE: FLEET VEHICLE | |
| --- | --- | --- | --- | --- |
| GPS SAMPLING INTERVAL | 30 S | | 10 S | |
| ERROR BOUNDARY (M) | 50 | 500 | 50 | 500 |
| COMPRESSION RATE | 30.51% | 85.97% | 87.17% | 98.17% |

FIG. 9

HIGH PERFORMANCE AND EFFICIENT MULTI-SCALE TRAJECTORY RETRIEVAL

FIELD

This disclosure relates generally to systems and method implementing retrieval of trajectory data, e.g., data such as may be used for pattern analysis solutions in various industry applications, e.g., vehicle domain. In one example, the disclosure may be implemented for retrieving trajectories at various granularity and visualization scope from massive trajectory data and huge size maps for use in common route analysis used in vehicle domain solutions.

BACKGROUND

Trajectory retrieval is a very common need in connected vehicle domain solutions, including not only trajectory replay on map, but also trajectory analysis such as pattern analysis, common route analysis, etc. with massive trajectory data and huge size map. Tremendous size of data transfer is always a burden for solutions and especially for mobile ones and when performing zoom-in/out operations, the situation will be much worse. As trajectory retrieval take a very role in kinds of industry application scenarios.

As known, a trajectory is typically constructed of data representing a time series of locations (longitude, latitude, and associated timestamps). In the context of a mapping out a trip (e.g., in a mapping application) with a relatively high sampling rate results in providing too many points, and this leads to very low performance when retrieving the whole trajectory to a client device, because of network bandwidth consumption.

It is important to provide an efficient approach to interactively and efficiently retrieve trajectory data based on usage needs (granularity and visualization scope, map scale level and etc.) for various domain solutions.

For example, trajectory data usage is a very common case in fleet management, vehicle management and even trajectory analysis, however current trajectory data storage and retrieval solutions are very inefficient efficient and more costly.

SUMMARY

A computer system, method and computer program product for retrieving trajectory data according to various degrees of visualization or granularity.

The system, method and computer program product are configured to leverage a key insight of trajectory information consumption pattern. When trajectory data is retrieved, there typically is no need to obtain very detail level information at every time. Thus, the system, method and computer program product leverages the usage context information to optimize the trajectory information retrieval detail level.

Thus, in one aspect, a system and method is configured to optimize a trajectory retrieval/query plan to greatly reduce transferred trajectory data size, smartly keep data quality and without any extra efforts like building index and snapshots. A method for trajectory data retrieval comprises: receiving, at a processor device, a user query including a request for displaying trajectory data at a user device; determining, from the user query, a query type and a current map visualization scale setting (mapscale) for visualizing the trajectory data on the user device display; selecting a reference level responsive to a user query type and the determined mapscale setting; accessing, from a memory storage device, a data set of compressed trajectory data according to the selected reference level; and communicating the compressed trajectory data set to the user device, for presentation on the user device display.

In a further aspect, there is provided a computer-implemented system for trajectory data retrieval. The system comprises: a memory storage device for storing trajectory data; a processor device communicatively coupled to the memory storage device, the processor device configured to: receive a user query including a request for displaying trajectory data at a user device; determine, from the user query, a query type and a current map visualization scale setting (mapscale) for visualizing the trajectory data on the user device display; select a reference level responsive to a user query type and the determined mapscale setting; access from the memory storage device a data set of compressed trajectory data according to the selected reference level; and communicate the compressed trajectory data set to the user device, for presentation on the user device display.

In a further aspect, there is provided a computer program product for performing operations. The computer program product includes a storage medium readable by a processing circuit and storing instructions run by the processing circuit for running a method. The method is the same as listed above.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIG. 9 depicts a table 700 showing example data points compression results for different error bound values that could be implemented in an embodiment;

DETAILED DESCRIPTION

The present disclosure describes a system and method to retrieve trajectory information from huge datasets.

The present disclosure describes a system and method and computer program product to retrieve trajectory data according to various degrees of visualization or granularity.

The system, method and computer program product are configured to leverage a key insight of trajectory information consumption pattern. When trajectory data is retrieved, there typically is no need to obtain very detailed level information at every request. Thus, the system, method and computer program product leverages the usage context information to optimize the trajectory information retrieval detail level.

In one aspect, a system and method is configured to optimize a trajectory retrieval/query plan to greatly reduce transferred trajectory data size, while intelligently maintaining and preserving data quality and without requiring any extra efforts like building index and snapshots.

Figure 1:
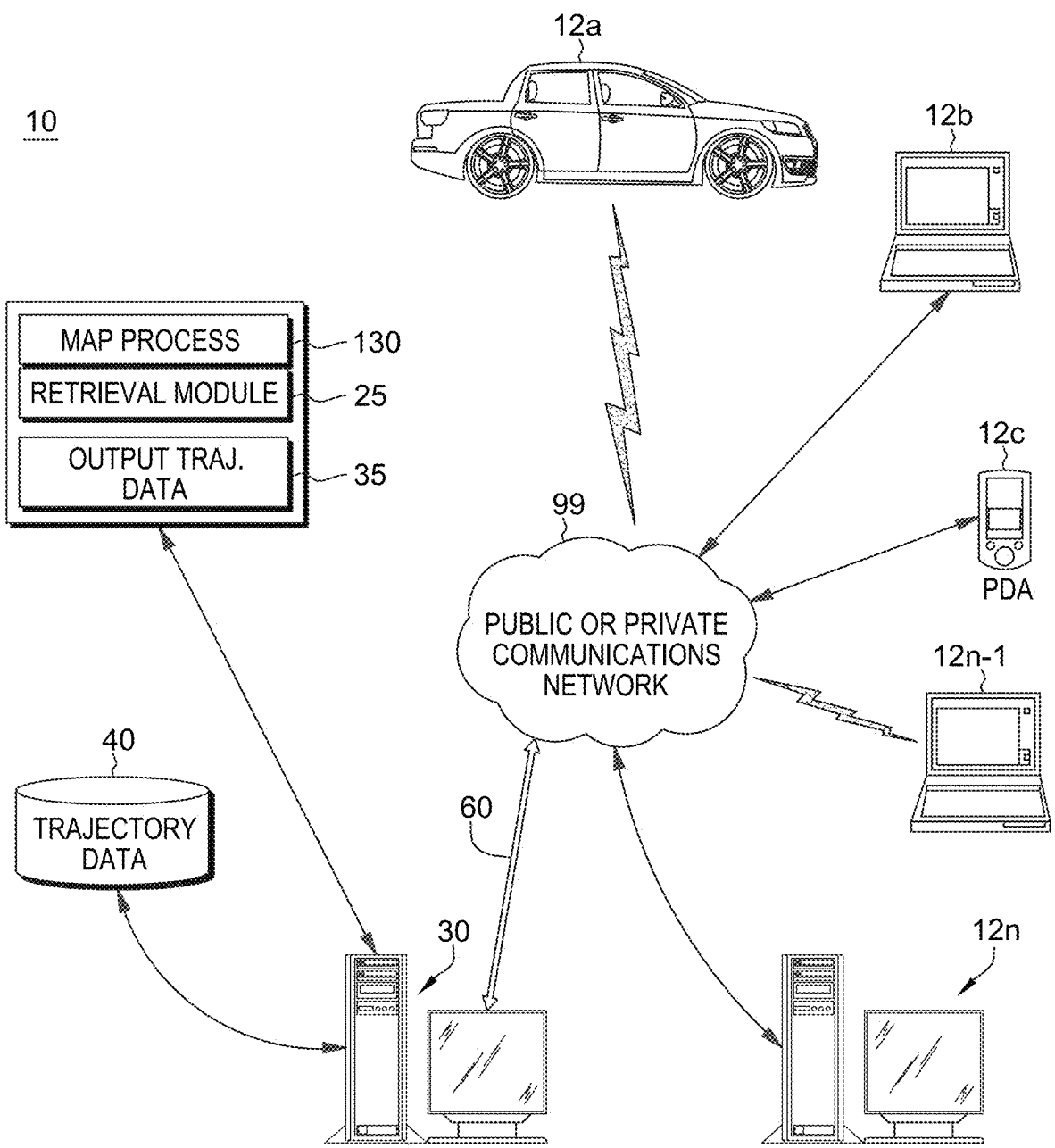
FIG. 1 shows conceptually a trajectory data request/retrieval system and method and the computer device for fulfilling user requests for trajectory data and providing the requested trajectory data according in one embodiment.

As shown in FIG. 1, there is provided a method and tool 10 for implementing a trajectory retrieval/query plan for a user (e.g., a vehicle fleet owner or a user wanting directions). The trajectory retrieval/query service is able to service various user entities (e.g., commercial or private use) with a common interface and cloud service. The service implements methods providing an approach such that, with usage context information such as a relevant trip time segment and user device display information, the service provides only enough information that can be output (returned) to the requestor is provided, thus reducing the data volume of trajectory information transferred without losing the effect of information consumption. With such feature, the trajectory retrieval performance on the other hands is greatly improved. This is especially the case in the context of a mobile application which can save greatly transferred data volume and save battery consumption accordingly at the mobile device.

In particular, FIG. 1 shows a conceptual service 10 for implementing a trajectory retrieval/query plan for users, e.g., private individuals or commercial entities, as represented by remotely connected devices 12a, . . . , 12n, e.g., a smartphone, laptop, mobile or desktop computer, a vehicle on-board diagnostics device, and other like computing devices that receive, use or store trajectory data. For example, for exemplary purposes, the requested trajectory data may be requested for use by a vehicle's on-board diagnostic device 12a, or a vehicle on-board global positioning system (GPS)/mapping program.

In one embodiment, via a wired or wireless communication of a network connected user device, e.g., devices 12a, . . . , 12n, a user (private individual or commercial entity) will be enabled to submit a query which, in response, requires the system to perform operations such as retrieving trajectory data and providing of the trajectory information back to the user device 12a, . . . , 12n, for visualization and/or display presentation thereof.

Responsive to a submitted query, the methods herein are adapted to fully consider a requesting client device's view scope and scale. In one embodiment, a "view scope" corresponds to a client (user's) device screen size, e.g., a mobile phone' visibility area or functional area of a map size (e.g., a bounding box).

Thus, from a user perspective, if a user wants to look at a very long trip to map, the method enables a lot of detail to be auto-ignored. The method adaptively returns a different level of compressed trajectory data, e.g., if a user looks from high level of map (e.g., the whole city level of a whole trip), the apparatus and method returns a highly compressed representation of trip data with few points. When a user drills down to look at further detail, the method only returns part of trip (that the current window display does not present). Thus, the system for trajectory data retrieval operates at multiple scales (is "Multi-scale"), i.e., the trajectory data (e.g., latitude, longitude and timestamp data) is compressed according to different levels.

In one embodiment of system 10, in view of FIG. 1, an entity, e.g., an individual user, operates a browser application in a computing device 12a, . . . , 12n running a mapping program, e.g., Google® Maps, Baidu Maps. Via wireless or cellular communications connectivity over a communications network 99 with a back end service embodied by a server device 30, the user may request directions via the mapping application. The request may be received over wireless communication links 60. The nature of the user request may require the back-end server 30 to implement a data retrieval software process 25 to retrieve requested trajectory data stored in a memory storage device, e.g., a database 40. The retrieved data 30 is obtained and communicated, e.g., over the wireless network connection or data link 60 back to the requesting device associated with the requesting entity.

In one embodiment, as will be explained in greater detail herein, the retrieval process 25 implements steps for query plan optimization, i.e., the optimizing of the retrieved trajectory data at an optimum scale, i.e., degree of detail, commensurate with network bandwidth and user context considerations. That is, the querying and retrieving of trajectory data is adaptive and operates at multiple scales. In one aspect, raw trajectory data (e.g., latitude, longitude and timestamp data) is stored compressed without losing the effect of information consumption. For example, the retrieval process 25 implements one or more steps to: (1) compress trajectory data according to multiple map scale levels (best selected from learning and while keeping relations within levels). In one embodiment, "learning" involves, for a certain application, obtaining a specified map scale level. This may be obtained from experience, e.g., 1 km, 200 meters and 50 meters are best for street level trajectory replay, while 10 km and above will not fit well; (2) select a "best" reference level when a retrieval request is received according to various factors including query type, map scale properties, data distribution, query patterns, etc. Examples of a "query pattern" can be: query critical points vs. query all detail foot prints, or query approximate time range vs. query exact time stamps when passing one point (e.g., a point of interest). A "best" reference level is determined by the application using the embodiments described herein. (3) use compressed data on the best reference level to filter data scope (by temporal conditions or spatial constraints); and (4) interpolate data based on the ones on the best reference level and other fitted levels to make query/ retrieval results more accurate. That is, as a trajectory is always recorded in intervals, e.g., 1 sec, 10 or more seconds, etc., in some embodiments there is a need to use interpolation to fill points which were not actually recorded but has right matching along the trajectory. On the other hand, compression is to reduce data while trying to keep accuracy; however, when it is desired to see details about one compressed trajectory segment, points data on more detail scale level can be used to enrich a rough one, one using an interpolation algorithm to fill extra but "correct" points. "Fitting" here means on the right trajectory logic and in acceptable error bounds.

Figure 2:
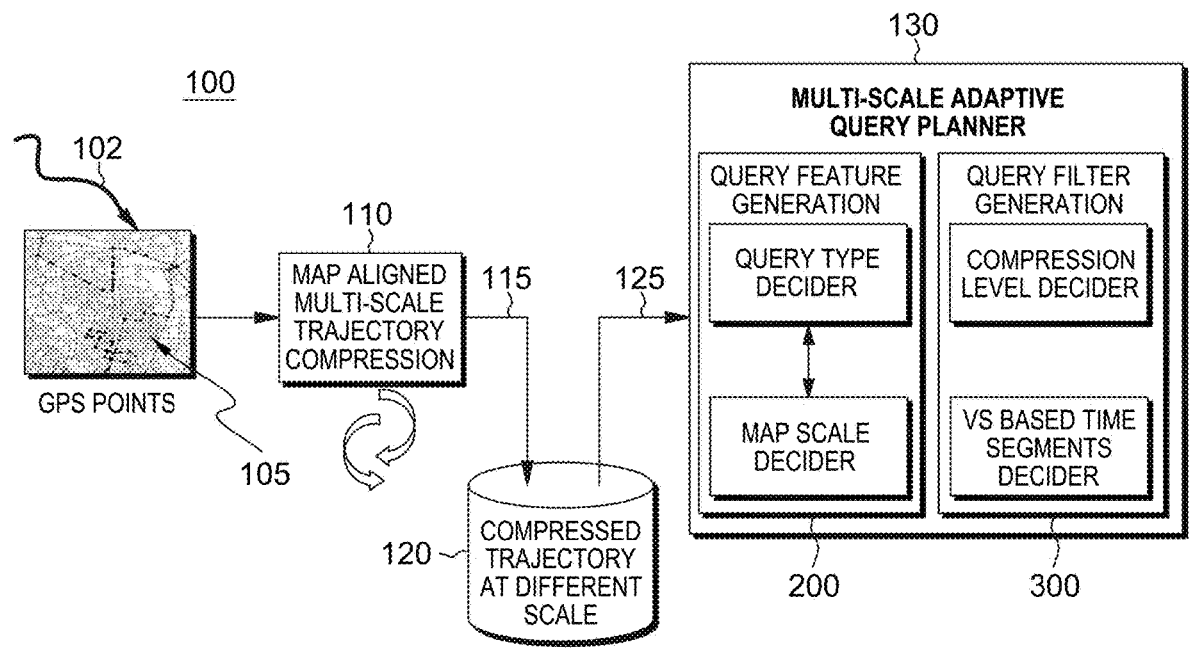
FIG. 2 shows a system diagram 100 depicting the methods and operations run by the retrieving process implemented at a computing device of FIG. 1.

FIG. 2 shows a system diagram 100 depicting the methods and operations run by the retrieving process 25 implemented at server device 30 of FIG. 1. In one embodiment, the system and method 100 is configured for adaptive trajectory retrieval, which can adaptive and user-interactive to perform trajectory data retrieval according to a different map visualization scale. Here, in FIG. 2, there is initially shown a request for providing a map or route 102, e.g., a vehicle route between a source location and target destination separated by a distance, that would normally be provided to the user device as multiple GPS data points data 105, obtained via a GPS application or mapping program present on a user device 12a, . . . , 12n. A first step shows the inputting of the trajectory data into a MAP-aligned Multi-Scale Trajectory Compression application 110 running on the device 30. In one embodiment, the Multi-Scale Trajectory Compression application 110 implements method steps to compress the multiple GPS data points data 105, i.e., select the usable data at a scale (level of detail) that satisfies the user request, and store the compressed multiple GPS data points data 105 as data sets 115 having multiple levels of scale or mapscale. This data may be stored in a further storage device such as a database 120.

In a further embodiment, a Map and request Adaptive Query Planner (MAP) process 130 is run at the server device 30 that accesses at 125 one or more of the data sets 115 at a determined level of scale (detail) from the further storage device 120. As will be described in further detail, the MAP process 130 implements a query feature generation module 200 and a query filter module 300 to analyze the user query/request, e.g., by detecting the query type request entered by the user via the GPS or mapping application program, for example, and determine the client device's proper scale level from the map of the display and device display area for use in selecting an optimum level of compressed map data points for return back to the user device application display.

Figure 4:
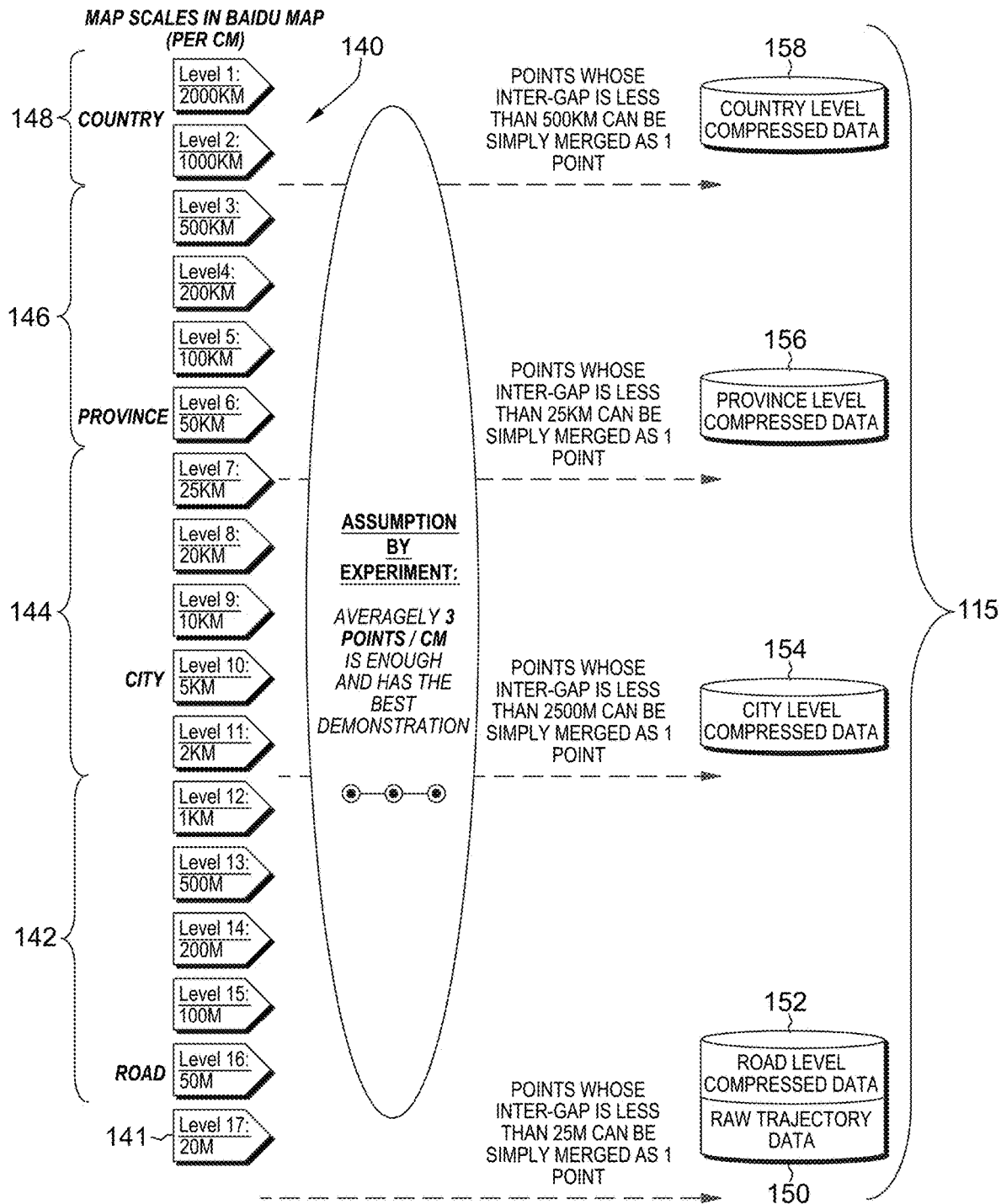
FIG. 4 depicts an example embodiment of the stored compressed database contents including multiple compressed data sets having multiple levels of scale.

FIG. 4 shows an example embodiment of the stored compressed database contents including multiple compressed data sets 115 having multiple levels of scale. These data sets 115 may be retrieved responsive to the MAP process 130 determining an appropriate mapscale and user context determination in response to a received user query, and communicated back to the map application, e.g., on a user device. For instance, such data may be accessed in accordance with a scale definition which may be a scale gradated similarly as a Google Map's or Baidu Map's service application interactive map display "zoom" bar or selector.

As shown in FIG. 4, the database 120 may store the trajectory data as data sets 115 associated with a plurality of defined map scale levels 140, the levels being associated with a certain "zoom" level or "mapscale" such as selectable via a mapping application. For example, database 120 may comprise the set of raw trajectory set data 150, e.g., received GPS point data of a mapped route 102, including an initial full amount of data points stored for map and route retrieval purposes with no compression level 141, e.g., data points stored at short distance granularity, e.g., an inter-gap or distance between two points, e.g., corresponding to 20 Meters.

Further, in the embodiment shown, a data set 152 stores compressed data in amounts corresponding to a next lowest level of compression 142, e.g., a "road" level, having plural zoom levels mapped to different distance scales therein. For example, a road level 142 may correspond to particular mapscale distances, e.g., levels, with each level corresponding to a corresponding data points set. Each data set is a compressed version of the raw data set so as to avoid an amount of detail. In one embodiment, an amount of compression applied by the compression algorithm to the raw data stored in obtaining data set 152 may be according to an algorithm or formula. In one embodiment, data at this road level 142 is obtained by combining the raw data points whose inter-gap is less than a fixed difference, e.g., 25 Meters, and merging these points as a single (1) data point for storage in the data set. Thus, responsive to the requests for trajectory data, in the embodiments described herein, the MAP process determines an appropriate mapscale level 142 corresponding to one or more zoom mapscale distances (e.g., levels corresponding point to point inter-gap distances ranging from 50 M, 100 M, 200 M, 500 M and/or 1 KM) therein, and/or drill down to a compression level mapped within level 142 and retrieve the corresponding data set 152 for communication to and presentation at the requesting device by the mapping application over a communications infrastructure in the manner as described with respect to FIG. 1.

A further data set 154 shown in the storage embodiment of FIG. 4 includes compressed trajectory data at a next lowest level of compression 144, e.g., a "city" level, having plural zoom levels mapped to different distance scales therein (e.g., levels corresponding point to point inter-gap distances ranging from 2 KM, 5 KM, 10 KM, 20 KM and/or 25 KM). In one embodiment, data sets 154 at this level 144 are obtained by combining the raw data points whose inter-gap is less than a fixed difference, e.g., 2500 Meters, and merging these points as a single (1) data point. Thus, the requests for trajectory data, in the embodiments described herein, the MAP process determines an appropriate mapscale and compression level and may drill down to a mapscale level 144 (or a sub mapscale level therein) and would retrieve the corresponding data set 154 for communication to and for presentation at the requesting device by the mapping application.

A further data set 156 shown in the storage embodiment of FIG. 4 includes compressed trajectory data at a next lowest level of compression 146, e.g., a state or "province" level, obtained by combining the raw data points whose inter-gap is less than a fixed difference, e.g., 25 km, and merging these points as a single (1) data point. Thus, the requests for trajectory data, in the embodiments described herein, the MAP process may determine an appropriate mapscale and compression level as a level 146 or a sub mapscale distance therein (e.g., levels corresponding point to point inter-gap distances ranging from 50 KM, 100 KM, 200 KM and/or 500 KM) and retrieves the corresponding data set 156 for communication to and presentation at the requesting device by the mapping application.

Likewise, data set 158 may include compressed trajectory data at a next lowest level of compression 148, e.g., a "country" level, obtained by combining the raw data points whose inter-gap is less than a fixed difference, e.g., 500 km, and merging these points as a single (1) data point. Thus, the requests for trajectory data, in the embodiments described herein, the MAP process may determine an appropriate mapscale and compression level 148 or sub mapscale distance therein (e.g., levels corresponding point to point inter-gap distances of 1000 km and/or 2000 km) and would retrieve the corresponding data set 158 for communication to and presentation at the requesting device.

Figure 3:
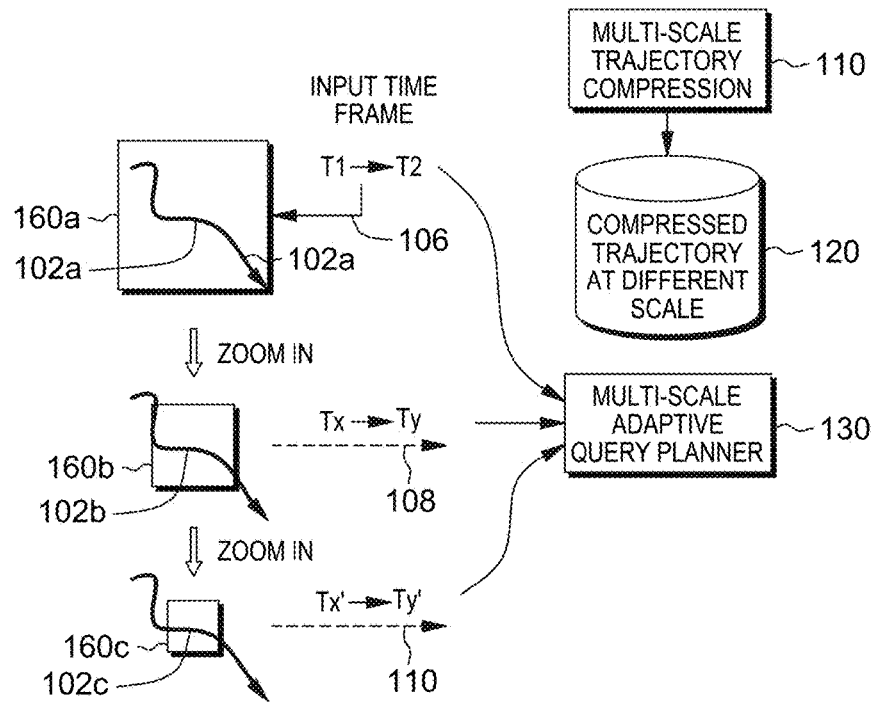
FIG. 3 depicts an example of adaptive retrieval of the compressed trajectory data points resulting from the running Map and request Adaptive Query Planner (MAP) process according in one embodiment.

In one embodiment, as depicted in the examples shown in FIG. 3 as a result of running Map and request Adaptive Query Planner (MAP) process 130, the data points compression retrieval is adaptive, i.e., given a different error bound (grain level), there is a different compression rate and a corresponding data set retrieved. That is, different view scopes of trajectory, e.g., whole or portions, is determined by different map scale level, thus leading to different data compression ratio, and a correspondingly different retrieved data size.

For example, in FIG. 3, there is depicted an example highest level map view 160a that would correspond to a presentation of a "whole" route 102a. This whole route 102a may correspond to an input time frame 106 including a source time, e.g., time T1, and a second time, e.g., a destination or arrival time T2 in which the traversal of the whole route 102a as shown is expected. Trajectory data retrieved for this whole route may be displayed on a user device. In this embodiment, a lower level of data grain may be used, i.e., a higher compression level (and consequently a larger error boundary results to provide this highest compression level) when displayed. In FIG. 3 there is further depicted the (MAP) process 130 that retrieves a data set associated with a medium level of map view 160b in which there is output for user device display a viewing of a zoomed-in route "portion" 102b. In this view 160b, an increased level of data grain is needed with a reduced level of compression. Finally, in FIG. 3, there is further depicted the (MAP) process 130 that retrieves a data set associated with a finest level of map view 160c in which there is output for user device display a viewing of a further zoomed-in route "portion" 102c. In this view, a further increased level of data grain is needed with even less level of compression (i.e., more points to show more fine grain view of route or trip).

The approach in retrieving and providing data is adaptive by considering a client's view scale and view scope, and adaptively selecting a proper level of compression to return, therefore saving bandwidth and improving performance. In the non-limiting example of the multiple-scale compression shown in FIG. 3, given a further user's context of an input time frame range 106 between a time T1 to a time T2, there may be a higher level of compression selected so that the retrieved trajectory data represents the "whole" route 102a with a lower level of data grain needed (e.g., a reduced sampling rate of GPS data points). However, given a user's context of a smaller display type, e.g., a small size display at the user device, this may correspond to an input time frame range 108 between a time Tx (e.g., T1<Tx) to a time Ty (e.g., Ty<T2), for example, there may be a reduced level of compression selected so that the retrieved trajectory data set represents the route "portion" 102b for display at the user device with a greater level of data grain needed (e.g., an increased sampling rate of GPS data points). Similarly, in a further example of user context, there is determined an user device display view Scope (display size) setting from in which it is determined a smaller input time frame range 110 between a time Tx' (e.g., Tx<Tx') to a time Ty (e.g., Ty'<Ty), for example, there may be a further reduced level of compression selected so that the retrieved trajectory data set represents a smaller route portion 102c for display at the user device with an even higher level of data grain needed (e.g., a maximum sampling rate of GPS data points).

As will be described in further detail, there is determined from the user query a time segment corresponding to a user device display type or physical size. In one embodiment, the method uses the timestamp information corresponding to the time segment for determining a corresponding level of compression for a whole trip or trip portion for display at the user device. That is, a traveling time range is another factor to determine compression level and ratio, e.g., for a vehicle running on city road, 5 min. time corresponds to approximately 5 km; thus, 5 km or 10 km map scale might be better to show its trace.

Figure 5:
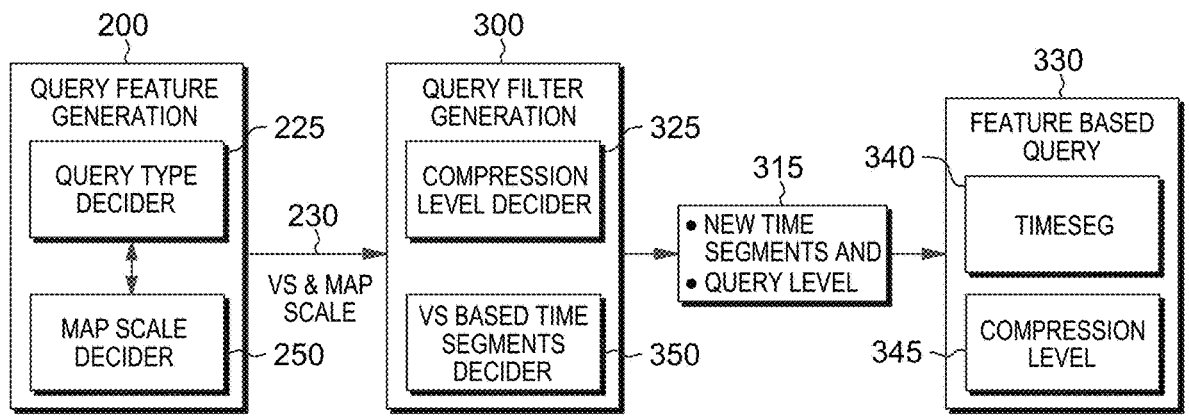
FIG. 5 depicts a more detailed block diagram of the Map and request Adaptive Query Planner (MAP) process 130 of FIG. 2.

FIG. 5 depicts a more detailed block diagram of the Map and request Adaptive Query Planner (MAP) process 130 of FIG. 2 for receiving and processing a user query, e.g., a request for a mapping a route between a current location and a target destination in a GPS map program, for example. Here the query feature generation process 200 receiving a user query, e.g., from Google Maps, and invokes two processing modules: a query type decider module 225 and a MAP scale decider 250. These processing blocks determine from user context associated with the query a viewscope and mapscale data 230 and correspond to a particular map scale level of compressed data to be obtained from a particular data set. The determined viewscope and mapscale level outputs 230 may then be input to the Query Filter generation process 300 that invokes two processing modules: a compression level decider 325 and a viewscope based time segments decider 350. These processing blocks determine from the viewscope and mapscale values determined from query feature generation process 300 outputs 315 including a new time segment(s) and a query level. These new time segment(s) and a query level values 315 may be used as inputs to a feature based query module 330 that generates a time segment 340, a compression level 345, or both, a compression level and time segment. In one embodiment, a "feature" here is more fundament concept, meaning temporal and spatial characters of one trajectory.

Figure 6:
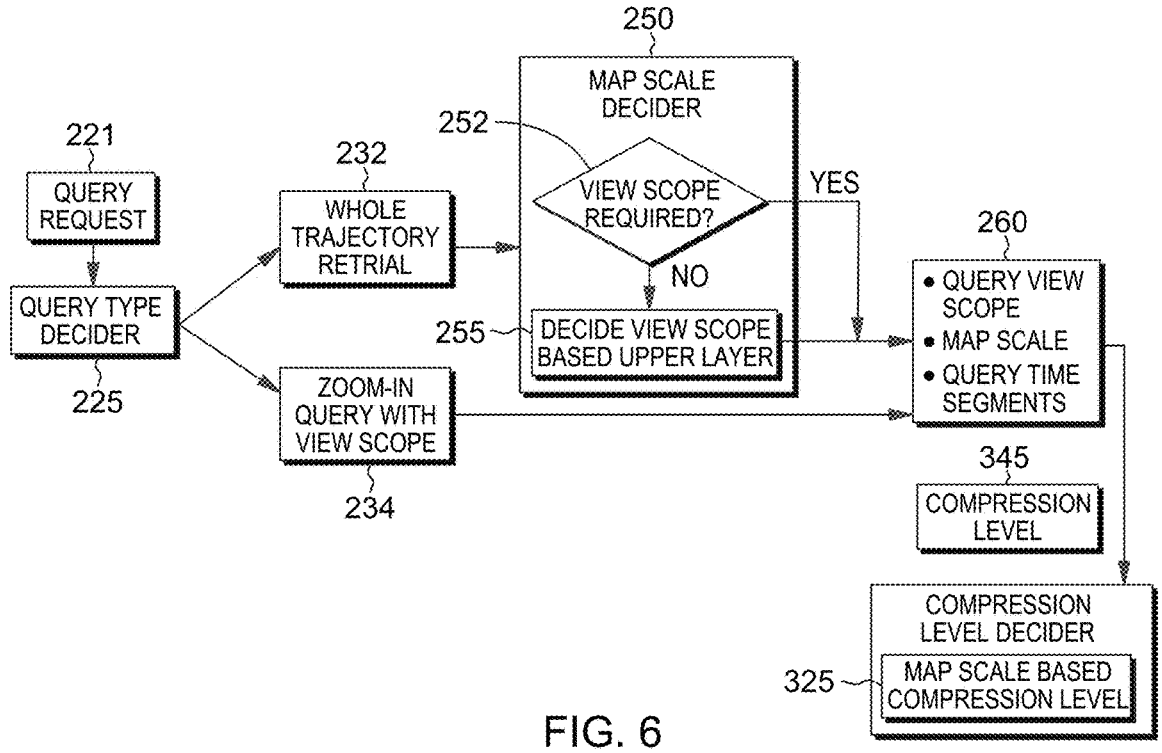
FIG. 6 is a detailed depiction of the query type decider process block 225 of FIG. 5.

FIG. 6 is a detailed depiction of the query type decider process block 225 of the Map and request Adaptive Query Planner (MAP) 130 shown in FIG. 5. In a first step 225, there is received a user request, i.e., a query 221, received via a wireless communications network connection, as sent by a user via a mobile device running a mapping application, such as shown in FIG. 1. Based on the detected query, the query type decider 225 determines whether the request is for a whole trajectory retrieval, i.e., whether trajectory data corresponding to the whole route is to be retrieved for display thereof at the user device as indicated at 232, or determines whether the request is a zoom-in query including zoom degree and view Scope information 234 to see a more detailed part of the trip.

That is, as shown at method step 225 of FIG. 6, a first step includes receiving at the processing server or like computing device, a query/request 221 from a user device, e.g., a mobile client. The query is analyzed by the Map and request Adaptive Query Planner (MAP) 130 as discussed herein by first detecting the query type request. In one embodiment, the query determiner unit 225 determines a first query type. In one embodiment, the query type request that may be determined is for a "whole" trip, or a "portion" of a trip. In one embodiment, the query may be selected via a user device from among a predetermined query set. Thus, the query type may be easily detected. Otherwise, from a known free form query type, there may be known parsing and lexical type determining algorithms (not shown) implemented by a search engine which may be used to determine a query type.

As shown in FIG. 6, at 225, if it is determined that the received input query is a zoom-in request including a map-scale and a determined viewScope setting 234, then the process proceeds to step 325 to invoke the compression level decider process of FIG. 5. Continuing to 325, inputs 260 to the process 325 for determining a compression level include the prior determined view Scope, map scale and input time frame (time segments) settings.

Otherwise, returning to step 225, if it is determined that the received input query requests a whole trajectory retrieval 232, the process proceeds to the MAP scale decider 250 which runs a method to determine a map scale. In one embodiment, the mapscale is determinable by the client device's current usage, e.g., via a mapping program application programming interface (API). More particularly, in the process 250, there is first determined at 252 whether a view Scope setting is required in the first instance. If at 252 it is determined that a view Scope is not required, then the process proceeds to step 255 in which the process decides a view Scope setting based upper layer. The upper layer settings are the best fitted map scale of current view scope. E.g. if a user currently is watching streets, and he also wants the whole trajectory data, the upper layer should be street level map scale level.

Then, once a view Scope setting is decided, the process proceeds to compression level decider 325, based on inputs 260 including the determined view Scope, map scale and input time frame (time segments) settings. Alternatively, referring back to 252, if it is determined that a view Scope is required, then the process proceeds directly to step 325 in which the process utilizes the determined view Scope, map scale and input time frame (time segments) settings to determine a compression level 345 at block 325. In one example, the compression level decider 325 may be implemented as a mapping table, which may be pre-built based on knowledge, e.g., knowing which map scale level should use a corresponding level of compression. Here, the compression level decider may simply map compression level from current user's map scale.

Once the compression level is determined by the compression level decider block 325, the MAP process will retrieve the appropriate trajectory data set 115 (see FIG. 4) at the appropriate level of compression for that user requested route/route portion.

Figure 6A:
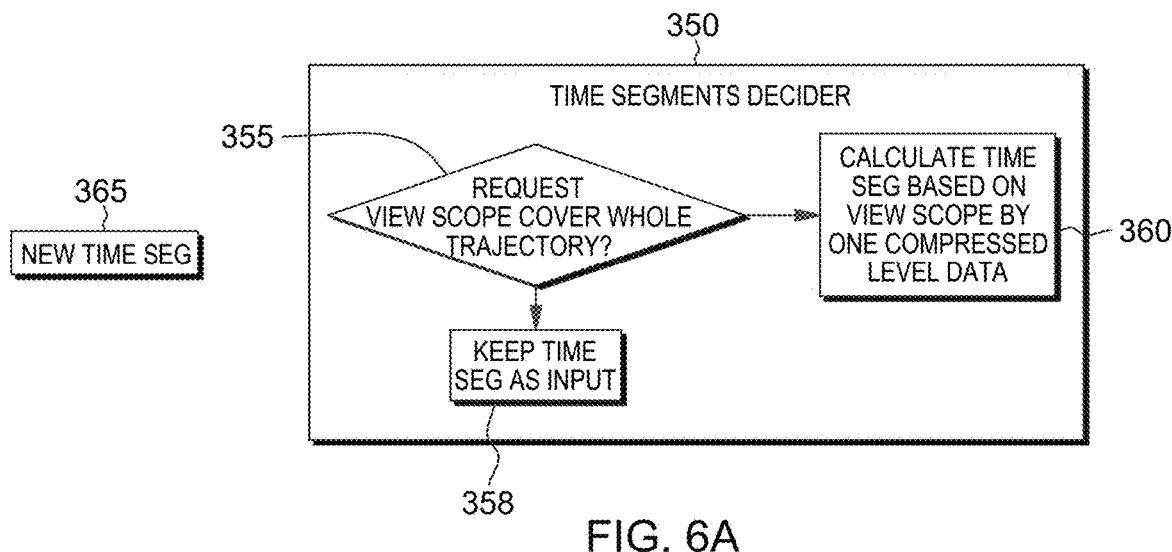
FIG. 6A shows additional processing performed by the time segments decider block 350 of FIG. 5

FIG. 6A shows additional processing performed by the time segments decider block 350 of FIG. 5 if time segments information is not determined or obtainable. For instance, an input time frame may not necessarily be specified, in which case the time frame or segment(s) may be determinable. In the processing of FIG. 6A, the time segments decider process 350 runs a first step 355 to determine whether the received user request includes a view Scope setting that covers the whole trajectory. If it is determined at 355 that the received view Scope setting does cover the whole trajectory, then the time segments decider 350 process outputs at 358 the user input time frame as the query time segment for use in determining the compression level at 325. Otherwise, returning to 355, if it is determined that the received view Scope setting does not cover the whole trajectory, then at 360, the time segments decider module 350 calculates a new time segment 365 based on the view Scope and best reference compressed level data (i.e., as determined needed by an application). In any event, the input specified time segment or the computed new time segment 365 is output by the decider 350 for use in determining the compression level at 325. That is, in one embodiment, a temporal query condition is transformed to a map scale level by approximate speed estimation and calculation.

Figure 7:
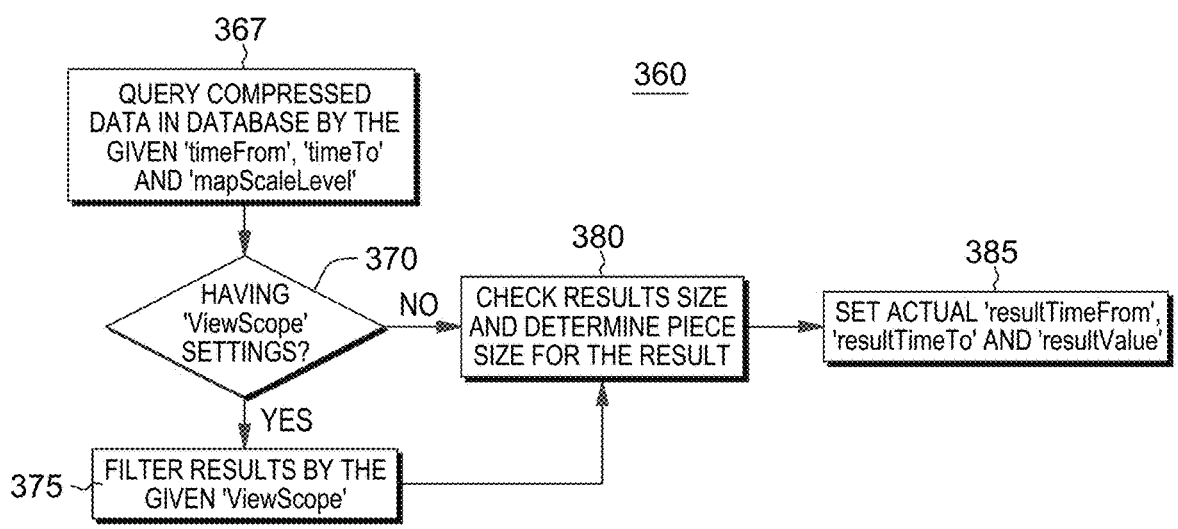
FIG. 7 depicts a processing of the time segments decider 350 responsive to receipt of the query request according to one embodiment.

FIG. 7 depicts a processing of the time segments decider 350 responsive to receipt of the query request. Here, a time segment is determined by a calculation based on view scope. In particular, FIG. 7 depicts the processing at block 360 to query the database and calculate the time segments based on received input view scope settings. As shown in FIG. 7, a first step 367 is the receiving at the Map and request Adaptive Query Planner 130 of server 30 a user query for compressed data in the database 120. In one embodiment, the user specifies or otherwise the system obtains a "mapScaleLevel" parameter specification which represents a scale, e.g., a display zoom setting, associated with the user device display, e.g., a mobile device. The mapScaleLevel parameter may be user specified, and/or obtained by identifying the communicating device. Further, the user specifies or otherwise, the system obtains the parameters specifying a desired input time frame in which the user may receive (download) trajectory data for visualizing a corresponding portion along a desired route. In one embodiment, the user specifies a source time "timeFrom", e.g., a current time, and an intermediate or destination target time, e.g., a time "timeTo" a user is expected to arrive at a final or intermediate destination—the query specifying or determined to have a "timeFrom" (e.g., T1, Tx or Tx'), a "timeTo" (e.g., T2, Ty or Ty'), and a "mapScaleLevel" parameter specification. As described, the timeFrom and timeTo user inputs can be transformed automatically from spatial condition and view scope. The input map scale level is often handled by the planner.

Then, at 370, the time segments decider block 300 of the Map and request Adaptive Query Planner (MAP) process 130 is programmed to determine whether such a "ViewScope" setting variable has been specified in the original query, or is determinable for the process of adaptively selecting the compressed data level. If there is a "ViewScope" settings determined or specified at 370, then the process will proceed to step 375 to perform filtering of the results according to the "ViewScope" setting and proceed to step 370. Otherwise, at 370, if it is determined such a "ViewScope" settings variable is not specified or determinable, then the process directly proceeds to step 380. At 380, FIG. 7, the Map and request Adaptive Query Planner 130 performs checking the results size and determine a data portion size for the compressed data level result. Then, at 385, the VS time segments decider 350 sets the actual time frame as a start time, e.g., by setting a "resultTimeFrom" timestamp, and a destination time "resultTimeTo" value, in addition to a "resultValue". Due to compression, the actually return time range will sometimes not equal to time ranges input by a user. For example, for raw data starting from 10:00 to 10:10, every 10 seconds has one point, but after compression, maybe only 10:00 has first point, and 10:08 has the last point, e.g., since a car stayed during the last 2 mins.

That is, the processing of FIG. 7 determines the current client's (user's) proper scale level from map. Thus, for example, if a whole trip is specified, then the system will decide the compression level parameters from trip's "view Scope" setting) and a corresponding time span; if part of a trip is specified, the compression level parameters will be decided by client's current focus area (i.e., a "view Scope" setting) or scale, and a corresponding time span.

As a result of the MAP processing of FIGS. 5 and 6, a mapping application or map service may drill down to a particular map level 140 and obtain map trajectory detail from a reduced (compressed) different data set. That is, based on map current scale, and scope (a device display screen's view Scope), two things are determined: 1) the compression level; 2) a time span. Based on the obtained time span (time segment) a part of trip may be selected and then by compression level, the trip data is compressed to a proper grain level for viewing.

Figure 8A:
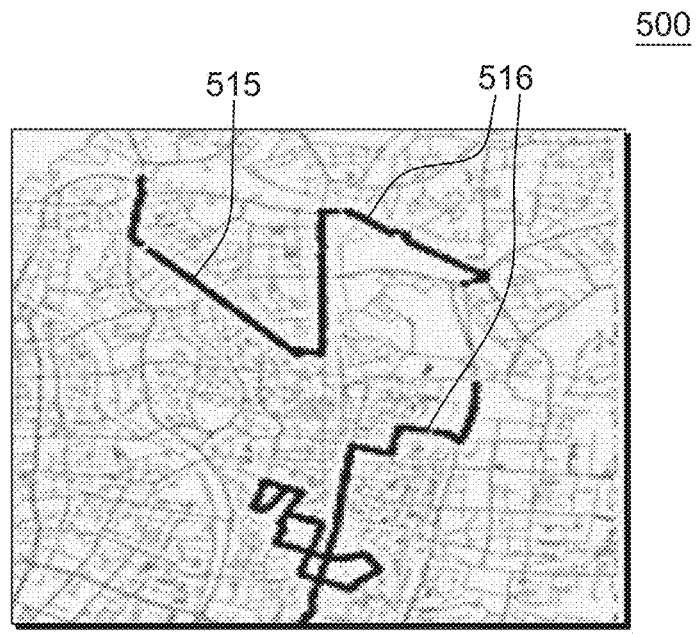
FIG. 8A depicts an example mapped route obtained by a mapping application for rendering on a user device screen based on largely uncompressed trajectory data without use of compression.
Figure 8B:
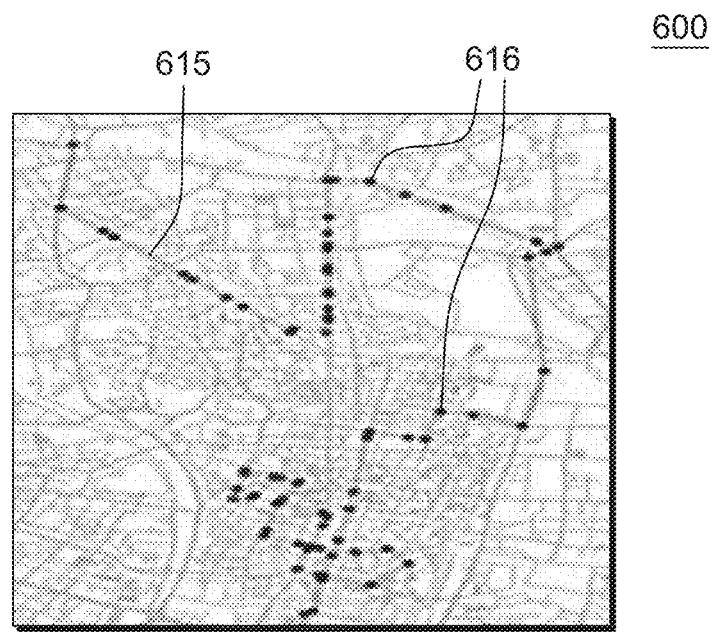
FIG. 8B shows the same user device display area as shown in FIG. 8A, however, depicting the route obtained and rendered on the screen based on largely compressed trajectory data with use of compression data obtained in accordance with the embodiments herein.

FIGS. 8A and 8B show a comparison of the results of retrieving trajectory data in accordance with prior art techniques as compared to results when implementing the MAP compression process 110 and MAP process 130 herein. As shown in a user device display area 500 of FIG. 5A, there is depicted an example trip or route 515 generated by a mapping application rendered on the user device screen 500. As shown, this rendering may be responsive to a user request determined as requiring retrieval of lower level uncompressed trajectory data without use of compression. Thus, the view of route 515 on the map display shows increased multiples of data points 516 forming the displayed route. FIG. 8B shows the same user device display area 600, however, depicting a vehicle trip or route 615 obtained and rendered on the screen 500 based on more compressed trajectory data with use of compression data obtained in accordance with the MAP compression process 110 described herein. Here, in FIG. 8B, there is depicted a map visualization result of the MAP process in which a highly compressed representation of trip data with fewer data points 616 is returned. Such a view with less grain detail may be obtained for user requests requiring retrieval of data corresponding to higher level map views, e.g. a whole city level portion of a trip 615, as compared, for example, to a full trajectory data view or a zoomed in or lower level in which an increased number of points is returned, such as shown in FIG. 8A.

FIG. 9 depicts a table 700 showing example data points compression for different error bound values that could be implemented in an embodiment. In FIG. 9, table 700 shows two types of GPS data points sampling, a lower GPS data point sampling 702, e.g., every 30 sec (corresponding to a highly compressed trajectory data) such as may be implemented by a city taxi service cap or like vehicle, and a higher sampling rate 722, e.g., every 10 sec (corresponding to a lower compressed map view) such as may be implemented by a vehicle fleet manager. Also depicted are a given different error bound (i.e., grain level) resulting in a different compression rate. For example, with an error bound of 50 meters at a GPS data point sampling rate 702 results in about a 30% compression level, and for an error bound of 500 meters, for this GPS point sampling rate 702 corresponds to about an 86% compression level. This is shown in contrast to an example error bound of 50 meters at the higher GPS data point sampling rate 722 that results in about a 87% compression level, and for an error bound of 500 meters, for this GPS point sampling rate 722 corresponds to about an 98% compression level. In one embodiment, the error-bound tolerance may be set by user. E.g., if a user wants to query trajectories during days, the user may not care about missing of 1 or 2 mins. of data.

Thus, in a higher level of map view, the lower level of grain is needed (i.e., a larger error boundary) to bring a higher compression level, e.g., a whole trip view. A lower level of map view, a higher level of grain is needed (e.g., a smaller error boundary) with less level of compression so as to obtain more points to show more fine grain view of trip). Thus, the program adapts to the specific user request and a determined mapscale view scale and view scope, by selecting a proper (best) level of compression to return, therefore saving communication bandwidth and improving performance.

Figure 10:
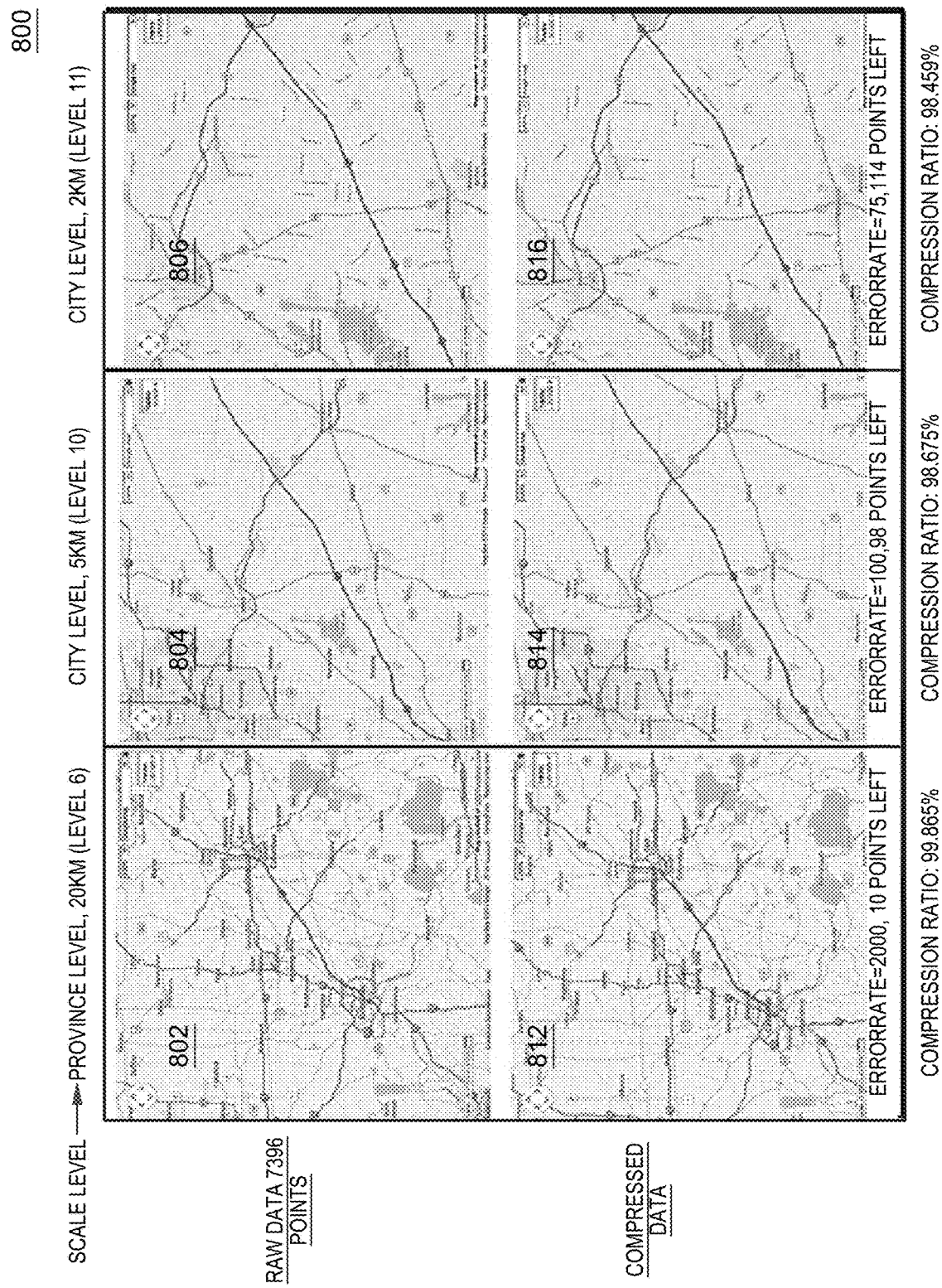
FIG. 10 shows a comparison of example map displays both before and after retrieving trajectory data at various map scale levels of compression; and the corresponding compression ratio.

FIG. 10 shows a comparison 800 of example map displays at different effort bound (grain level). Here, there is compared map trip views resulting from retrieval of uncompressed trajectory data and a view after retrieving trajectory data at various levels of compression. For example, at a "province" level map view there is depicted display of a whole trip 802 at no level of compression, e.g., in which a large amount of raw data points, e.g., 7396, are used for the display. A corresponding compressed trajectory data set 156 has been stored and this data is retrieved responsive to a user request. The resultant display at the user device of the whole trip route 812 is shown at a larger error rate (e.g., 2000 M), however the amount of trajectory data (number of data points) stored and retrieved for this level view is significantly reduced to achieve a compression ratio of about 99.865% according to the methods herein.

Likewise, for example, at a "city" level map view (at a predetermined level "10" corresponding to inter-gap distance of 5 km), there is depicted display of a trip portion 804 at no compression, e.g., in which the same amount of raw data points are used for the display. A corresponding compressed trajectory data set 154 had been stored and this data is retrieved responsive to a user request. The resultant display of the whole trip route 814 is shown at a reduced error rate (e.g., 100 M), however the amount of trajectory data (number of data points) stored and retrieved for this level view is significantly reduced to achieve a compression ratio of about 99.675% according to the methods herein.

Similarly, for example, at a further "city" level map view (at a predetermined level "11" corresponding to inter-gap distance of 2 km), there is depicted display of a trip portion 806 at no compression, e.g., in which the same amount of raw data points are used for the display. A corresponding compressed trajectory data set 154 had been stored and this data is retrieved responsive to a user request. The resultant display of the whole trip route 816 is shown at a reduced error rate (e.g., 75 M), however the amount of trajectory data (number of data points) stored and retrieved for this level view is reduced to achieve a compression ratio of about 98.459% according to the methods herein.

Thus, from the examples shown in FIG. 10, with usage context information, there is provided only enough information that can be output (returned) to the requestor, thus reducing the data volume of trajectory information transferred without losing the effect of information consumption. With such feature, the trajectory retrieval performance and on the other hands is greatly improved, especially in the context of a mobile application which can save greatly transferred data volume and save battery consumption accordingly at the mobile device.

One example implementation of the techniques described herein are to reduce an amount of storage of trajectory points, such as provided to as part of "On-board diagnostics" (OBD) data which refers to a vehicle's self-diagnostic and reporting capability and having data sizes are typically very large, e.g., on the order of gigabytes, terabytes or more, so as to result in reduced storage costs. Moreover, use of these techniques permit usage of trajectory information from different sources of vehicle route data according to different vehicle types, and accordingly the OBD's data of various vehicle types can be collected is very complex and different. In connected vehicle areas, OBD data can be uploaded to capture vehicle's status, e.g., engine operation status such as including but not limited to: fuel consumption amount, temperature, rpm, speed, etc.

Use of these techniques additionally provide ability to retrieve a trajectory and transfer the data to a client device, e.g., a local laptop computing device or mobile device, for replay in order to reduce costs associated from the perspective of both response time and economy. For example, in reducing transferred GPS data points amounts there is reduced costs associated with the retrieving GPS position data points for trajectory replay which is very costly. There is also reduced costs associated with many calls to a map provider (e.g., in charge by points scheme) in addition to reduced costs associated with overlay of GPS data points to a mapping application which is also very costly.

Use of these techniques provide increased facility for trajectory "jump" on a detail map scale (e.g., 10 M level), which techniques involve proper data interpolation as current sampling rates cannot satisfy such map scale selection granularity. A typical interpolation may involve filling extra points data every fixed time interval or spatial distance; but they may have drawbacks on visualization as "jump" for car's speed is not always same.

Figure 11:
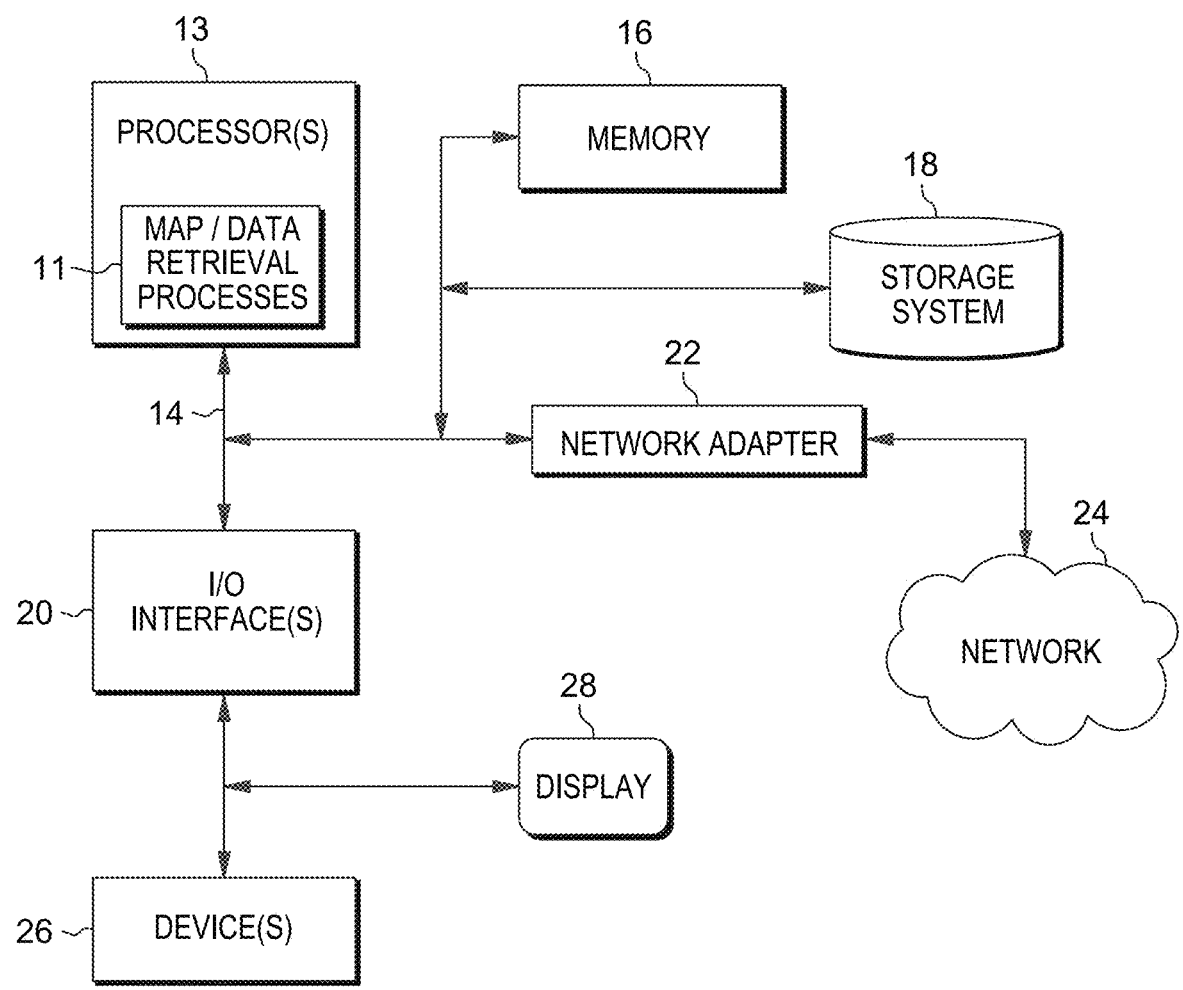
FIG. 11 illustrates a portion of a computer system, including a CPU and a conventional memory in which the present invention may be embodied.

FIG. 11 illustrates a schematic of an example computer or processing system that may implement the trajectory data retrieval operations in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 11 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 13, a system memory 16, and a bus 14 that couples various system components including system memory 16 to processor 13. The processor 13 may include a module 11 that performs the Map and request Adaptive Query Planner (MAP) processes described herein. The module 11 may be programmed into the integrated circuits of the processor 13, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for retrieving and displaying trajectory data comprising:
    storing vehicle trajectory data associated with a route previously traveled by a vehicle between a source location and target destination, said vehicle trajectory data stored in a memory storage device as multiple compressed vehicle trajectory data sets corresponding to multiple map visualization scale (mapscale) levels, each compressed vehicle trajectory data set corresponding to a different compression level and a corresponding reduced amount of compressed raw vehicle trajectory data used for visualizing the vehicle's previously traveled route, each different compression level corresponding to a different sampling of raw time series Global Positioning System (GPS) data points associated with the vehicle's previously traveled route;
    receiving, at a processor device associated with the memory storage device, a user query including a request for displaying vehicle trajectory data associated with the vehicle's previously traveled route over a map displayed via a user device display;
    determining, using the processor device, from said received user query, a current map visualization scale setting (mapscale) for visualizing the vehicle trajectory data of the vehicle's previously traveled route on the user device display;
    determining, using the processor device, from communications received from said user device, a user device display type for visualizing the vehicle trajectory data of the vehicle's previously traveled route at the user device display, said user device display type corresponding to a physical size of the user device display;
    determining, using the processor device, a compression level and a time segment corresponding to the route previously traveled by said vehicle responsive to the user device display type and the determined mapscale setting, the determined compression level selected to filter a data scope by reducing an amount of vehicle trajectory data while maintaining a detail level quality for the user device display without building an index or using an index for the vehicle trajectory data;
    accessing, using the processor device, from the memory storage device, the reduced amount of vehicle trajectory data from a stored compressed vehicle trajectory data set selected according to said determined compression level and said determined time segment;
    communicating said reduced amount of vehicle trajectory data over a communications network for receipt at said user device, and
    presenting, using the processor device, a vehicle trajectory display of the previously traveled vehicle route on the user device display at the maintained detail level quality based on said received reduced amount of vehicle trajectory data.

2. The method of claim 1, further comprising:
    adaptively retrieving vehicle trajectory data at a different compression level depending upon a determined network bandwidth used for communicating vehicle trajectory data over said communication network.

3. The method of claim 1, wherein said time series of Global Positioning System (GPS) data points include vehicle location data representing longitude, latitude, and timestamp information, wherein said vehicle trajectory data stored according to said one or more predetermined compression levels comprises: sampled GPS data points at predetermined sampling rates (grain level), each grain level associated with a corresponding error bound wherein,
    for a user query type requesting a zoomed-out higher level of map view of a vehicle route, providing a high compression vehicle trajectory data set corresponding to a lower level of grain, and
    for a user query type requesting a zoomed-in lower level view of a vehicle route, providing a low compression vehicle trajectory data set corresponding to a higher level of grain.

4. The method of claim 3, further comprising:
    using said timestamp information corresponding to the time segment for determining a corresponding vehicle route for display at said user device.

5. The method of claim 1, wherein said data points associated with the previously traveled vehicle route are stored according to one or more time intervals based on a predetermined sampling rate, said presenting a trajectory display of the previously traveled vehicle route on the user device display further comprising:
    increasing a detail level of a displayed previously traveled vehicle route by interpolation to fill points which were not recorded and which fill points are configured to fit along a vehicle route within an acceptable error bound.

6. The method of claim 1, wherein said determining a compression level and a time segment corresponding to a route previously traveled by said vehicle further comprises:
    receiving, at the processor device, an initial input time frame from the user query comprising an initial start time and an initial end time and the mapscale level;
    determine, based on said user device display type for visualizing the received compressed trajectory data set at the user device and the mapscale setting, a resulting time segment comprising a resulting start time segment and a resulting end time;
    determining, the compression level using said resulting start time and resulting end time of said time segment.

7. The method of claim 1, wherein each respective compressed raw trajectory data set corresponding to a different compression level comprises a merging of raw data points having an inter-gap distance less than a fixed spatial distance into a single data point for storage in the respective dataset at that compression level.

8. A computer-implemented system for retrieving and displaying trajectory data comprising:
    a memory storage device for storing trajectory data;
    a processor device communicatively coupled to said memory storage device, the processor device configured to:
        store vehicle trajectory data associated with a route previously traveled by a vehicle between a source location and target destination, said vehicle trajectory data stored in a memory storage device as multiple compressed vehicle trajectory data sets corresponding to multiple map visualization scale (mapscale) levels, each compressed vehicle trajectory data set corresponding to a different compression level and a corresponding reduced amount of vehicle trajectory data used for visualizing the vehicle's previously traveled route, each different compression level corresponding to a different sampling of raw time series Global Positioning System (GPS) data points associated with the vehicle's previously traveled route;

receive a user query including a request for displaying vehicle trajectory data associated with the vehicle's previously traveled route over a map displayed via a user device display;

determine, from said received user query, a current map visualization scale setting (mapscale) for visualizing the vehicle trajectory data of the vehicle's previously traveled route on the user device display;

determine, from communications received from said user device, a user device display type for visualizing the vehicle trajectory data of the vehicle's previously traveled route at the user device display, said user device display type corresponding to a physical size of the user device display;

determine a compression level and a corresponding time segment corresponding to the route previously traveled by said vehicle responsive to the user device display type and the determined mapscale setting, the determined compression level selected to filter a data scope by reducing an amount of vehicle trajectory data while maintaining a detail level quality for the user device display without building an index or using an index for the vehicle trajectory data;

access from the memory storage device the reduced amount of vehicle trajectory data according to said compression level and said determined time segment; and communicate said reduced amount of vehicle trajectory data over a communications network for receipt at said user device, and present a vehicle trajectory display of the previously traveled vehicle route on the user device display at the maintained detail level quality based on said received reduced amount of vehicle trajectory data.

9. The system of claim 8, wherein said processor device is further configured to:
adaptively retrieve vehicle trajectory data at a different compression level depending upon a network bandwidth used for communicating vehicle trajectory data over said communication network.

10. The system of claim 8, wherein said time series of Global Positioning System (GPS) data points, include vehicle location data representing longitude, latitude, and timestamp information, wherein to store said vehicle trajectory data according to said one or more predetermined compression levels, said processor device is further configured to:
sample GPS data points at predetermined sampling rates (grain level), each grain level associated with a corresponding error bound wherein,
for a user query type requesting a zoomed-out higher level of map view of a vehicle route, providing a high compression vehicle trajectory data set corresponding to a lower level of grain, and
for a user query type requesting a zoomed-in lower level view of a vehicle route, providing a low compression vehicle trajectory data set corresponding to a higher level of grain.

11. The system of claim 10, wherein said processor device is further configured to:
use said timestamp information corresponding to the time segment for determining a corresponding vehicle route for display at said user device.

12. The system of claim 8, wherein said data points associated with the previously traveled vehicle route are stored according to one or more time intervals based on a predetermined sampling rate, wherein to present a trajectory display of the previously traveled vehicle route on the user device display, said processor device is further configured to:
increase a detail level of a displayed previously traveled vehicle route by interpolation to fill points which were not recorded and which fill points are configured to fit along a vehicle route within an acceptable error bound.

13. The system of claim 8, wherein to determine a compression level and a time segment corresponding to a route previously traveled by said vehicle, said processor device is configured to:
receive an initial input time frame from the user query comprising an initial start time and an initial end time and the mapscale level;
determine, based on said user device display type for visualizing the received compressed trajectory data set at the user device and the mapscale setting, a resulting time segment comprising a resulting start time segment and a resulting end time;
determine the compression level using said resulting start time and resulting end time of said time segment.

14. The system of claim 8, wherein to store a respective compressed raw trajectory data set corresponding to a different compression level, said processor device is configured to:
merge raw data points having an inter-gap distance less than a fixed spatial distance into a single data point for storage in the respective dataset at that compression level.

15. A computer program product comprising:
a non-transitory computer readable storage medium, said medium tangibly embodying a program of instructions executable by the computer for trajectory data retrieval, said program of instructions, when executing, configuring the computer to perform a method comprising:
storing vehicle trajectory data associated with a route previously traveled by a vehicle between a source location and target destination, said vehicle trajectory data stored in a memory storage device as multiple compressed vehicle trajectory data sets corresponding to multiple map visualization scale (mapscale) levels, each compressed vehicle trajectory data set corresponding to a different compression level and a corresponding reduced amount of vehicle trajectory data used for visualizing the vehicle's previously traveled route, each different compression level corresponding to a different sampling of raw time series Global Positioning System (GPS) data points associated with the vehicle's previously traveled route;
receiving a user query including a request for displaying trajectory data associated with the vehicle's previously route over a map displayed via a user device display;
determining from said user query a query type and a current map visualization scale setting (mapscale) for visualizing the vehicle trajectory data of the vehicle's previously traveled route on the user device display;
determining, from communications received from said user device, a user device display type for visualizing the vehicle trajectory data of the vehicle's previously traveled route at the user device display, said user device display type corresponding to a physical size of the user device display;

determining a compression level and a corresponding time segment corresponding to the route previously traveled by said vehicle responsive to the user device display type and the determined mapscale setting, the determined compression level selected to filter a data scope by reducing an amount of vehicle trajectory data while maintaining a detail level quality for the user device display without building an index or using an index for the vehicle trajectory data;

accessing, from the memory storage device, the reduced amount of stored compressed vehicle trajectory data according to said compression level and said determined time segment;

communicating said reduced amount of vehicle trajectory data over a communications network for receipt at said user device, and presenting a vehicle trajectory display of the previously traveled vehicle route on the user device display at the maintained detail level quality based on said received reduced amount of vehicle trajectory data.

16. The computer program product of claim 15, wherein the method further comprises:

adaptively retrieving vehicle trajectory data at a different compression level depending upon a network bandwidth used for communicating vehicle trajectory data over said communication network.

17. The computer program product of claim 15, wherein said time series of Global Positioning System (GPS) data points include vehicle location data representing longitude, latitude, and timestamp information, wherein said vehicle trajectory data stored according to said one or more predetermined compression levels comprises: sampled GPS data points at predetermined sampling rates (grain level), each grain level associated with a corresponding error bound wherein, for a user query type requesting a zoomed-out higher level of map view of a vehicle route, providing a high compression vehicle trajectory data set corresponding to a lower level of grain, and for a user query type requesting a zoomed-in lower level view of a vehicle route, providing a low compression vehicle trajectory data set corresponding to a higher level of grain.

18. The computer program product of claim 17, wherein said method further comprises:

using said timestamp information corresponding to the time segment for determining a corresponding vehicle route for display at said user device.

19. The computer program product of claim 15, wherein said data points associated with the previously traveled vehicle route are stored according to one or more time intervals based on a predetermined sampling rate, wherein to present a trajectory display of the previously traveled vehicle route on the user device display, said program of instructions, when executing, further configure the computer to:

increase a detail level of a displayed previously traveled vehicle route by interpolation to fill points which were not recorded and which fill points are configured to fit along a vehicle route within an acceptable error bound.

* * * * *